(12) United States Patent
Cruijssen et al.

(10) Patent No.: US 10,737,808 B2
(45) Date of Patent: Aug. 11, 2020

(54) SOLAR PANEL AND FLEXIBLE RADIATOR FOR A SPACECRAFT

(71) Applicant: Airbus Defence and Space Netherlands B.V., Leiden (NL)

(72) Inventors: Johan Hendrik Cruijssen, Leiden (NL); Petrus Cornelis Datema, Hoofddorp (NL); Bruin Benthem, Leiden (NL)

(73) Assignee: Airbus Defence and Space Netherlands B.V., Leiden (NL)

( * ) Notice: Subject to any disclaimer, the term of this patent is extended or adjusted under 35 U.S.C. 154(b) by 661 days.

(21) Appl. No.: 15/497,281

(22) Filed: Apr. 26, 2017

(65) Prior Publication Data
US 2017/0320600 A1 Nov. 9, 2017

(30) Foreign Application Priority Data
Apr. 26, 2016 (NL) ...................................... 2016677

(51) Int. Cl.
*B64G 1/44* (2006.01)
*B64G 1/50* (2006.01)
(Continued)

(52) U.S. Cl.
CPC ............. *B64G 1/443* (2013.01); *B64G 1/222* (2013.01); *B64G 1/503* (2013.01);
(Continued)

(58) Field of Classification Search
CPC .......... B64G 1/222; B64G 1/44; B64G 1/443; B64G 1/503
(Continued)

(56) References Cited

U.S. PATENT DOCUMENTS 5,732,765 A * 3/1998 Drolen ..................... B64G 1/50
165/41
5,806,800 A * 9/1998 Caplin .................. B64G 1/503
165/41
(Continued)

FOREIGN PATENT DOCUMENTS

EP 0151505 A1 8/1985
EP 0218858 A1 10/1987
(Continued)

Primary Examiner — James S Bergin
(74) Attorney, Agent, or Firm — N.V. Nederlandsch Octrooibureau; Catherine A. Shultz; Tamara C. Stegmann (57) ABSTRACT

A spacecraft (10), comprising a body (12), a solar array (30) with a support panel (32) which is connected to the body, and a thermal radiator (50) that is connected to the body and which includes a radiator substrate (52) that is thermally coupled to the body via at least one heat link (64). The solar array and thermal radiator are configured to be transitioned from a stowed state wherein the support panel and the radiator substrate are held fixed in an overlapping arrangement along and near the body, to a deployed state wherein the solar array is unfolded with the support panel positioned at a distance from the body and the radiator substrate is folded away from the body and the solar array.
Preferably, the solar array and thermal radiator are flexible, to allow them to be kept in an overlapping and temporarily bent shape in the stowed state.

12 Claims, 10 Drawing Sheets

(51) Int. Cl.
  *B64G 1/22* (2006.01)
  *H01L 31/041* (2014.01)
  *H02S 30/20* (2014.01)
  *H01L 31/0392* (2006.01)
  *H01L 31/048* (2014.01)
  *H01L 31/05* (2014.01)

(52) U.S. Cl.
  CPC ...... *H01L 31/03926* (2013.01); *H01L 31/041* (2014.12); *H01L 31/048* (2013.01); *H01L 31/0508* (2013.01); *H02S 30/20* (2014.12)

(58) Field of Classification Search
  USPC ...................................................... 244/172.7
  See application file for complete search history.

(56) References Cited

U.S. PATENT DOCUMENTS

| | | | | |
|---|---|---|---|---|
| 5,927,654 | A * | 7/1999 | Foley ................... | B64G 1/222 |
| | | | | 244/172.6 |
| 6,581,883 | B2 * | 6/2003 | McGee ................. | B64G 1/222 |
| | | | | 136/245 |
| 6,595,470 | B2 * | 7/2003 | Keeler .................. | B64G 1/222 |
| | | | | 165/41 |
| 6,669,147 | B2 * | 12/2003 | Bertheux ............... | B64G 1/503 |
| | | | | 244/172.6 |
| 7,028,953 | B2 * | 4/2006 | Sebata .................. | B64G 1/503 |
| | | | | 244/171.8 |
| 7,874,520 | B2 * | 1/2011 | McKinnon ........... | B64G 1/503 |
| | | | | 244/171.8 |
| 8,714,492 | B2 * | 5/2014 | Goodzeit .............. | B64G 1/222 |
| | | | | 244/171.8 |
| 9,004,410 | B1 | 4/2015 | Steele et al. | |
| 9,079,673 | B1 * | 7/2015 | Steele ................... | B64G 1/443 |
| 9,296,493 | B2 * | 3/2016 | Aston .................... | B64G 1/10 |
| 9,352,855 | B2 * | 5/2016 | Wong .................... | B64G 1/503 |
| 9,764,861 | B2 * | 9/2017 | Walker .................. | B64G 1/222 |
| 10,340,843 | B2 * | 7/2019 | Cruijssen ............. | H01L 31/0547 |
| 2003/0015625 | A1 | 1/2003 | McGee et al. | |
| 2014/0299714 | A1 | 10/2014 | Wong | |
| 2017/0063296 | A1 * | 3/2017 | Cruijssen ............... | H02S 40/22 |

FOREIGN PATENT DOCUMENTS

| | | |
|---|---|---|
| EP | 0780304 A1 | 6/1997 |
| EP | 0786404 A1 | 7/1997 |
| EP | 2907757 A1 | 8/2015 |
| FR | 3006298 A1 | 12/2014 |
| JP | 03114999 | 5/1991 |

* cited by examiner

SOLAR PANEL AND FLEXIBLE RADIATOR FOR A SPACECRAFT

TECHNICAL FIELD

The invention relates to a combination of a solar array and a radiator for a spacecraft, and to a spacecraft provided with such a combination of a solar array and a radiator.

BACKGROUND ART

Solar arrays for use in or on spacecraft are known. Such solar arrays are typically used for powering the spacecraft based on photovoltaic (PV) conversion of solar radiation. Various solar cell arrangements for converting solar radiation into electricity have been proposed for space applications. Exemplary coupling and deployment mechanisms for solar panels are described in patent documents U.S. Pat. Nos. 6,091,016 and 6,031,178.

It is also common to exploit thermal radiation in/on spacecraft to dissipate excess heat into space. This excess heat may be generated by various sources (e.g. power devices, equipment, or propulsion systems) in or on the spacecraft. Typically, excess heat is rejected via thermal radiation from the side walls of the spacecraft, which are facing away from the sun. In addition, excess heat may also be dissipated by means of deployable radiator panels or substrates. An exemplary deployable radiator arrangement, with multiple radiator panels that are hingeably coupled to the body of the spacecraft, is described in patent document EP0780304A1.

The area on a spacecraft that is available for allocating solar collection and/or thermal dissipation functionality may, however, be very limited. This may be particularly problematic for small spacecraft, or for spacecraft that have high requirements in relation to solar radiation collection and/or to waste heat dissipation.

It may therefore be desirable to provide a spatially compact solar array and thermal radiator arrangement for space applications. Alternatively or in addition, it may be desirable to provide a solar array and thermal radiator arrangement for space applications, which complies with stringent geometrical and mechanical specifications (e.g. structural robustness and/or mechanical resonance behavior) for both the stowed state and the deployed state of the spacecraft.

SUMMARY OF INVENTION

Therefore, according to a first aspect, there is provided a spacecraft, comprising a body, a solar array, and a thermal radiator. The support panel is articulately connected to the body. The thermal radiator is articulately connected to the body, and includes a radiator substrate that is thermally coupled to the body via at least one heat link. The solar array and thermal radiator are configured to be transitioned from a stowed state wherein the support panel and the radiator substrate are held fixed in an overlapping arrangement along and near the body, to a deployed state wherein the solar array is unfolded with the support panel positioned at a distance from the body and the radiator substrate is folded away from the body and the solar array.

By holding the radiator substrate and the solar array in an overlapping arrangement along the spacecraft body, a compact stack of panel(s) and substrate(s) can be obtained when the spacecraft is in the stowed state e.g. during the launch stage. Such compact arrangement may be beneficial in view of the limited space available inside a payload fairing (nose cone). The proposed overlapping arrangement of the solar array and thermal radiator may be particularly useful for spacecraft that have only little outer surface area available and/or which carry solar arrays that occupy a relatively large portion of the spacecraft's outer surface in the stowed state.

According to an embodiment, the solar array comprises a support panel that is at least partially flexible to allow the solar array to be temporarily retained in a bent panel shape near the body, to provide geometrical stiffness (i.e. temporarily increased mechanical stiffness due to temporary shape deformation) in the stowed state. Here, the thermal radiator may be sufficiently flexible to follow a curvature of the bent panel shape to keep the solar array and the radiator substrate in a similarly curved and overlapping arrangement in the stowed state. The overlapping arrangement of the array and radiator may for example be an abutting arrangement.

Preferably, at least the solar panel is elastically deformable i.e. temporarily flexible by external stress, but able to (reversibly) form back to its equilibrium shape after release of the external stress, due to internal restoring forces. In addition, the thermal radiator with radiator substrate preferably is sufficiently flexible and reversibly deformable to allow it to conform to the temporarily curved solar panel in the stowed state of the spacecraft. Although the thermal radiator preferably is also elastically deformable on a macroscopic scale, the required restoring forces may be provided by an additional radiator support structure, instead of by the radiator substrate. In the stowed state, the assembly of the solar array (with its support structure) and radiator substrate (possibly with its own support structure) may be retained in a macroscopically curved shape, to increase the mechanical stiffness of the assembly. This increased stiffness yields a higher resonance frequency (for instance above 30 Hz) than in the case of a flat arrangement. By (temporarily) bending the solar array and radiator substrate in the stowed state, the resonance frequency of the arrangement may be shifted away from the mechanical vibration behavior of the launch vehicle during the launching phase. The temporarily bent arrangement reduces the probability of unwanted mechanical resonances, which might be harmful to the solar array and/or the thermal radiator, and thus may help to increase dynamic performance in the stowed configuration.

According to an embodiment, the solar array comprises a plurality of concentrator reflector members. Each of the reflector members is provided with a photovoltaic cell and a reflective area on opposite sides. The reflector members are repositionable from a retracted state wherein the concentrator reflector members are in a substantially flat arrangement when the solar array is in the stowed state, into an extended state wherein the concentrator reflector members are raised to allow the reflective areas to reflect solar radiation towards the exposed photovoltaic cells when the solar array is in the deployed state. The concentrator reflector members may for example be formed as half-parabolic cylindrical sheets made from and/or at least partially covered with an optically reflective material. A solar array with repositionable concentrator reflector elements of this type is described in patent application publication US2017/006296A1, which is assigned to the current applicant, and is hereby incorporated by reference in its entirety.

The array with repositionable concentrator reflector members forms a selectively deployable solar concentrator, with reflective areas and PV cells provided on opposite surfaces of repositionable concentrator reflector members. In the retracted state of the array, the concentrator reflector members form a flattened arrangement with a reduced height. This yields a reduced stowage volume and greater mechanical robustness in the launch phase of the spacecraft (in stowed state). After launch of the spacecraft, the concentrator reflector members may be repositioned into the extended state, wherein the reflective areas on the front surfaces form an efficient concentrator arrangement that is configured to receive solar radiation and to redirect this radiation towards the photovoltaic elements provided on the rear surfaces. This allows a reduction of required photovoltaic cell area and associated PV cell costs. When the concentrator reflector members are in the retracted state, they may form a mutually overlapping arrangement, wherein a rear surface of one member covers at least part of a front surfaces of a directly adjacent member. The overlapping arrangement of the concentrator reflector members allows flattening of the arrangement to a reduced height in the retracted state of the array, while providing a considerable effective concentrator surface in the extended state.

The concentrator reflector members may be formed as elongated rectangular strips, each comprising a first alongside edge that is mechanically coupled to the support panel, and a second alongside edge opposite to the first alongside edge, which is suspended freely and is bendable away from the support panel, to allow repositioning from the retracted state to the extended state. This shape and arrangement of the concentrator reflector members allows front surfaces of the concentrator reflector sheet members to form reflective parabolic cylindrical areas in the extended state, for receiving solar radiation and for reflecting and focusing this solar radiation towards photovoltaic cells arranged on the rear surfaces of adjacent concentrator reflector sheet members.

In a further embodiment wherein the support panel is at least partially flexible, the arrangement formed by the support panel, the concentrator reflector members in the retracted state, and the radiator substrate, may be jointly retained in a bent (curved) shape, to increase the stiffness of the entire arrangement in the stowed state.

According to an embodiment, the thermal radiator is hingeably coupled along a radiator edge to the body. In this embodiment, the spacecraft comprises a further thermal radiator with a further radiator substrate. The further radiator substrate is hingeably coupled along a corresponding radiator edge to the body on an opposite side of the solar array.

The hinge connections between the at least one thermal radiator and the spacecraft body allows the at least one thermal radiator to pivot from a stowed position against the spacecraft body to an unfolded position away from the spacecraft body. The stowed position may correspond to a tilt angle between the radiator substrate and the local surface of the spacecraft body of about 0°, whereas the unfolded position may correspond to a tilt angle of more than 90° degrees (either in a positive or negative rotation direction) away from the spacecraft body surface. Preferably the tilt angle between the radiator substrate and the local surface of the spacecraft body in the unfolded position of the thermal radiator is in a range of ±150° to ±180°. This unfolded tilt angle may help to prevent the thermal radiator from obstructing the solar array during its deployment, and/or from obscuring the solar array in the deployed state to yield a good field of view (FOV).

According to an embodiment, the solar array is retained in an overlapping arrangement with the one or more thermal radiators in the stowed state. In this overlapping arrangement, the support panel of the solar array is situated between the body and the one or more radiator substrates.

When the thermal radiator covers the solar array in the stowed state, the radiator substrate may function as a temporary protective cover for the solar array, at least prior to the transition into the deployed state. The heat regulation capability of the thermal radiator in the stowed position may help in controlling the temperature of the stowed solar array. In embodiments wherein the solar array includes extendable/repositionable concentrator reflector members, the radiator substrate may also help in retaining the concentrator reflector members in their retracted state (e.g. during launch). In this way, mechanical forces needed for temporarily flattening the concentrator reflector members can be exerted by the radiator structure in the stowed position (e.g. by a pre-tensioned flexible radiator membrane), thus obviating the need for a separate flattening mechanism for the concentrator reflector members.

According to a further embodiment, at least one of the thermal radiator and the further thermal radiator are configured to fix the solar array along at least one edge of the support panel with respect to the body, when in the stowed state. The thermal radiator and/or further thermal radiator may have a size that is equal to or larger than the characteristic size of the support panel of the solar array, and may entirely cover the support panel when in the stowed state.

In yet a further embodiment, the thermal radiator and the further thermal radiator mutually overlap and jointly cover the support panel of the solar array, when in the stowed state. Here, the support panel of the solar array is retained between the spacecraft body and both the radiator substrates.

In alternative embodiments, the support panel of the solar array covers the one or more thermal radiators in the stowed state. In such alternative arrangements, the one or more radiator substrates is/are situated between the spacecraft body and the support panel.

When the support panel of the solar array covers the radiator substrate in the stowed state, the solar array may function as a protective cover and a temporary restraint for the radiator substrate, at least prior to transition into the deployed state. In turn, the thermal radiator in the stowed position may physically protect the spacecraft body. Furthermore, the heat regulation capability of the thermal radiator in the stowed position may help in controlling the temperature of the spacecraft body.

According to an embodiment, the solar array comprises a cover foil. This cover foil is adapted to cover the concentrator reflector members in the retracted state, and to prevent the concentrator reflector members from repositioning into the extended state, for example in the prelaunch and/or launch condition of the spacecraft, at least until the spacecraft has reached a required orbit.

Such a cover foil provides a simple disposable mechanism for protecting the concentrator reflector members and for retaining the concentrator reflector members in the retracted state. The cover foil may be applied in the single panel configurations as well as in the multiple panel configurations. The cover foil may be pre-tensioned in the stowed state in such a manner that transitioning into the deployed state causes or otherwise involves self-removal of the cover foil, to allow the concentrator reflector members to reposition into the extended state.

According to an embodiment, the spacecraft comprises a hold-down mechanism for simultaneously fixing the solar array and the thermal radiator to the satellite body in the stowed state.

The overlapping arrangement of the radiator substrate and the solar array in the stowed state allows the use of a hold-down mechanism for simultaneously retaining both the solar array and the radiator substrate along the satellite body. This yields a simplified hold-down mechanism and/or allows minimization of the number of hold-down elements in the hold-down mechanism.

According to a further embodiment, the hold-down mechanism comprises retaining members. The retaining members are configured for pressing down lateral edges of the support panel towards the spacecraft body and for retaining the support panel in a bent panel shape, when the spacecraft is in the stowed state.

Advantages of initial bending of the arrangement including the solar array and the thermal radiator in the stowed state, for adapting resonance frequency behavior, have already been discussed herein above.

In further embodiments wherein the solar array includes concentrator reflector members and the cover foil, the retaining members may be configured for keeping the cover foil pressed onto the concentrator reflector members in the retracted state.

The hold-down mechanism may comprise tensioning cabling for preventing the hold-down mechanism from releasing the solar array from the satellite body in the stowed state, and a thermal knife for cutting the tensioning cabling and releasing the hold-down mechanism to let the solar array assume the deployed state.

As there are few options for correcting a failing release mechanism in space, the number of release mechanisms is preferably minimal. Therefore, the hold-down mechanism may comprise only one redundant hold-down and locking point for affixing the solar array to the satellite body. Accordingly, the solar array may comprise a reinforcement member provided with an aperture. In this case, the hold-down mechanism may be adapted to extend through the aperture to restrict both in-plane and out-of-plane motion of the array support member with respect to the spacecraft body, when the solar array and the thermal radiator are in the stowed state. The single locking point and aperture may be adapted for affixing a central region of the solar array and the thermal radiator to the satellite body. This hold-down point is preferably located near the center of the support panel. Preferably, the support panel and reinforcement member of the solar array have apertures that are coinciding, so that the hold-down mechanism may extend through both apertures simultaneously.

BRIEF DESCRIPTION OF DRAWINGS

Embodiments will now be described, by way of example only, with reference to the accompanying schematic drawings in which corresponding reference symbols indicate corresponding parts. In the drawings, like numerals designate like elements. Multiple instances of an element may each include a separate letter or index appended to the element number. In those cases, the element number may be used without an appended letter (e.g. "20") to refer to an unspecified instance of the element or to generally refer to every instance of the element, whereas the element number may include an appended letter (e.g. "20a") to refer to a specific instance of the element.

The figures are meant for illustrative purposes only, and do not serve as restriction of the scope or the protection as laid down by the claims.

DESCRIPTION OF EMBODIMENTS

The following is a description of certain embodiments of the invention, given by way of example only and with reference to the figures. It should be understood that the directional definitions and preferred orientations presented herein merely serve to elucidate geometrical relations for specific embodiments. The concepts of the invention discussed herein are not limited to these directional definitions and preferred orientations. Similarly, directional terms in the specification and claims, such as "front", "back/rear", "top," "bottom," "left," "right," "up," "down," "upper," "lower," "proximal," "distal" and the like, are used herein solely to indicate relative directions and are not otherwise intended to limit the scope of the invention or claims.

Figure 1:
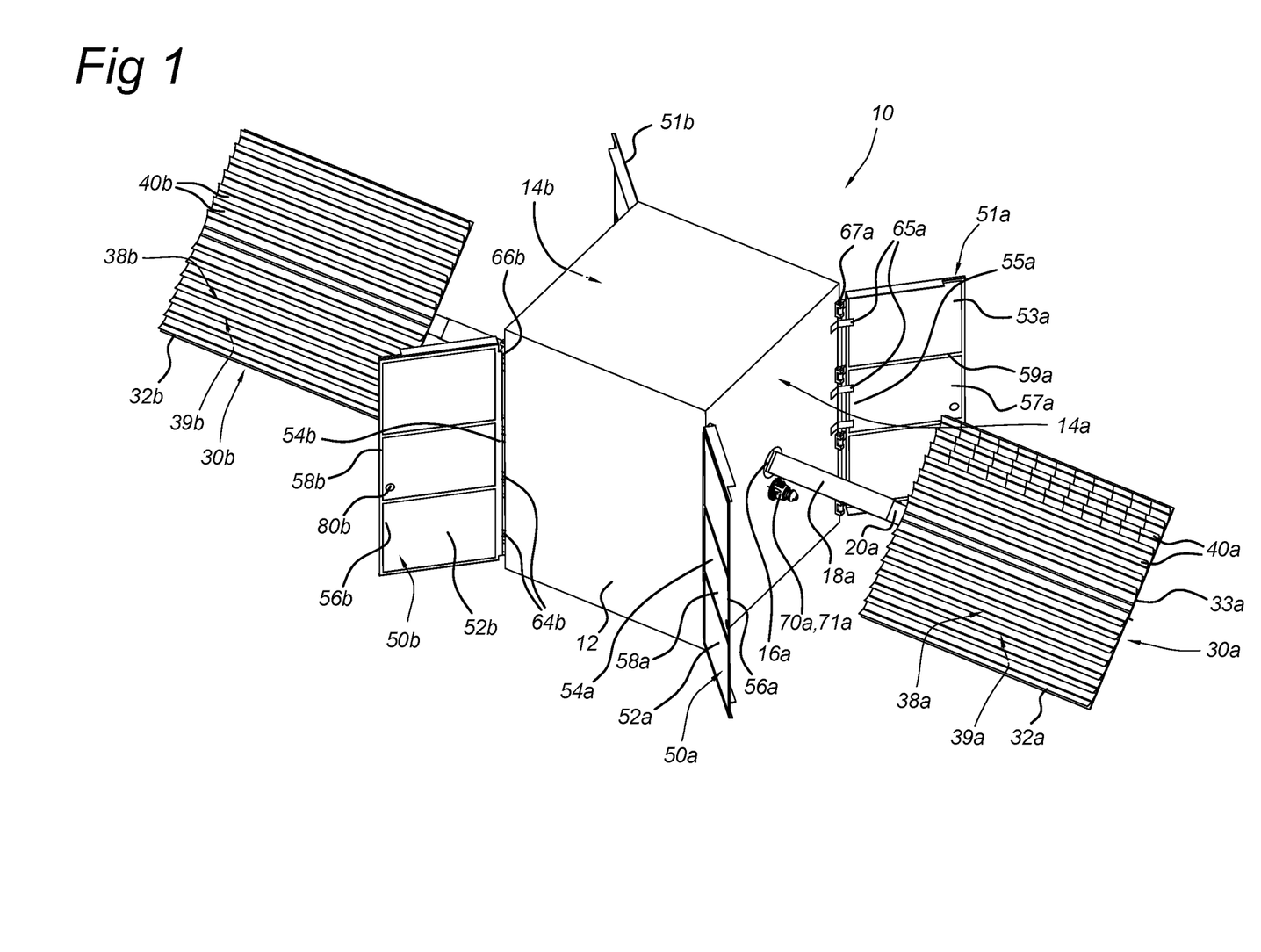
FIG. 1 schematically shows a perspective view of a spacecraft according to an embodiment.

FIG. 1 schematically shows a perspective view of an embodiment of a spacecraft 10. In this example, the spacecraft is formed as a satellite unit 10. The satellite unit 10 includes a body 12, two solar arrays 30a, 30b, and four thermal radiators 50a, 50b, 51a, 51b. The satellite body 12 has been schematically depicted in FIG. 1 as a box with multiple faces, but may have a different (more complex) shape. The satellite unit 10 comprises an electrical power system (not indicated in FIG. 1) in or on the satellite body 12, which is adapted to receive electric power generated by the solar arrays 30.

In FIG. 1, the solar arrays 30 are shown in a fully deployed state, wherein solar radiation may be received and converted into electricity. Each solar array 30 comprises a support panel 32 and an array of parallel rows of concentrator reflector members 40. In this example, the support panel 32 has a rectangular shape that defines two pairs of opposite edges. The support panel 32 comprises for instance a honeycomb core structure or a uni-body sheet, depending on the required bending flexibility.

In this example, the two solar panels 30a, 30b are mechanically coupled to two opposite lateral faces 14a, 14b of the satellite body 12. Each solar panel 30 is coupled to the satellite body 12 via a joint 16, an arm 18, and a further joint 20.

The arm 18 may be made for instance of lightweight carbon fiber reinforced plastic (CFRP) or equivalent. The arm 18 with joints 16, 20 serves as a primary deployment boom for positioning the solar panel 30 at an appropriate distance from the satellite body 12, to reduce unwanted shadowing by the satellite body 12 onto the solar panel 30.

The joint 16 is adapted for adjusting the facing direction of the solar panel 30 in the deployed state, e.g. via hinging and/or rotating motion. The further joint 20 defines a hinged connection to provide an additional degree of freedom for canting the solar panel 30. Both the joint 16 and the further joint 20 comprise actuation mechanisms (not shown) that are remotely operable, so that the associated solar panel 30 may be moved relative to the satellite body 12 and track the direction of the sun. These joints 16, 20 may function based on controllably reversible actuator mechanisms (e.g. actively driven motors), and/or passive irreversible actuators (e.g. spring driven mechanisms). A "carpenter rule" type hinge may also be employed, which is sufficiently biased in advance to deploy the solar panels.

FIG. 1 depicts the solar panels 30 with concentrator reflector members 40 positioned in an extended state. Here, the concentrator reflector members 40 are formed as predominantly parallel rows of flexible strips, which are mounted on a front surface 38 of the support panel 32. The concentrator reflector members 40 are self-deployable, so that they can self-extend to their deployed operational configuration, as soon as restraining forces from an external retaining mechanism are removed. The concentrator reflector members 40 may be biased, to extend themselves to their operational configuration in the absence of external restraining forces. In the extended state, the concentrator reflector members 40 are curvedly shaped, to function as optical concentrators that reflect incident solar radiation towards a rear surface of an adjacent concentrator reflector member 40. In this example, front surfaces of the concentrator reflector members 40 in the extended state form an array of off-axis cylindrical parabolic mirrors with a relatively short focal length. Rear surfaces of the concentrator reflector members 40 accommodate PV cells (e.g. made of Gallium Arsenide). Due to the (half-) parabolic cylinder shape of the front surfaces, incoming light rays that impinge on distinct parts of a front surface of a concentrator reflector member 40 in the extended state will be concentrated towards a same focal line region. In the extended state of the concentrator reflector members 40, the focal line region of each (row of) front surface(s) will (at least partially) coincide with a (row of) PV cell(s) on a nearby (row of) rear surface(s) of an adjacent concentrator reflector member 40.

The support panel 32 is provided with a mechanically rigid reinforcement beam 33, to provide structural reinforcement once the solar array 30 has assumed the deployed state. In this example, the support beam 33 has an elongated shape and extends on a rear surface 39 of the support panel 32 along a centerline thereof, and substantially parallel with lateral panel edges.

The thermal radiators 50a, 50b, 51a, 51b of the satellite unit 10 are hingeably coupled along respective edges 54a, 54b, 55a, 55b to the satellite body 12. The corresponding thermal radiator 50 and further thermal radiator 51 are arranged on opposite lateral sides of the associated solar array 30. Each of the thermal radiators 50, 51 is articulately connected to the satellite body 12 via associated hinge connections 66, 67. Each of the thermal radiators 50, 51 includes a flexible radiator substrate 52, 53 as well as a radiator frame 58, 59 that supports and spans the associated radiator substrate 52, 53.

Each radiator substrate 52, 53 is thermally coupled to the body 12 via flexible heat links 64, 65, which allow transport of heat from the satellite body 12 to the radiator substrates 52, 53. The radiator substrates 52, 53 comprise materials with high thermal conductivity and emissivity properties. The radiator substrates 52, 53 and heat links 64, 65 may be constructed in accordance with principles described in European patent application EP2907757A1, which is assigned to the current applicant and incorporated herein by reference in its entirety.

In this example, the radiator frames 58, 59 are constructed from a lattice arrangement of flexible battens or girders. The thermal radiators 50, 51 can thus be formed with a sufficient mechanical stiffness to ensure that a predetermined shape (e.g. rectangular) is maintained when the thermal radiators are not subjected to stress, and with a sufficient mechanical flexibility to allow temporary and reversible deformation of the thermal radiators 50, 51 when subjected to (limited) stress.

The thermal radiators 50, 51 are articulately coupled along their frames 58, 59 to the satellite body 12 via respective hinge connections 66, 67 provided along the respective coupled radiator edges 54, 55. These hinges 66, 67 allow the thermal radiators 50, 51 to swing from their stowed positions with all radiator edges 54, 55, 56, 57 substantially along the satellite body 12 body, to unfolded positions wherein free edges 56, 57 of the thermal radiators 50, 51 are pivoted away from the satellite body 12. The stowed positions may correspond to a tilt angle between the radiator substrate 52, 53 and the lateral surface 14 of the spacecraft body 12 of about 0°, whereas the unfolded position may correspond with a tilt angle in a range of ±150° to ±180°, to prevent the thermal radiators 50, 51 from obstructing the solar arrays 30 during their deployment, and from obscuring them once deployed.

The solar arrays 30 and thermal radiators 50, 51 are configured to be transitioned from a stowed state to a deployed state. In the stowed state, the associated support panels 32 and radiator substrates 52, 53 are held fixed in an overlapping arrangement along and near the satellite body 12. In the deployed state, the support panels 32 are unfolded to positions remote from the body 12, and the radiator substrates 52, 53 are folded away from the satellite body 12 as well as from the solar arrays 30.

The satellite unit 10 may comprise a sensor and processor arrangement (not shown) that is configured for tracking the position of the sun relative to the satellite body 12, and for repositioning the solar panels 30 with respect to the satellite body 12, so that radiation from the sun will impinge onto the panel surfaces in an essentially perpendicular direction.

The satellite unit 10 in FIG. 1 further comprises hold down mechanisms 70. Each hold-down mechanism 70 is provided on a lateral surface 14 of the satellite body 12, and adapted to fix an associated solar panel 30 and thermal radiator panels 50, 51 to the satellite body 12 when in the stowed state.

The hold-down mechanism 70 comprises a central actuator unit 71 based on a thermal knife actuation principle. The principle is explained in patent document U.S. Pat. No. 4,540,873 (hereby incorporated by reference in its entirety). In alternative embodiments, the actuator unit may be implemented based on other principles e.g. a pyro-activated release mechanism.

FIGS. 2a-2d depict another embodiment of a spacecraft 110. Features in the spacecraft 110 that have already been described above with reference to the spacecraft 10 shown in FIG. 1 may also be present in the spacecraft 110 shown in FIGS. 2a-2d, and will not all be discussed here again. In the discussion with reference to FIGS. 2a-2d, like features are designated with similar reference numerals preceded by 100 to distinguish the embodiments.

Figure 2A:
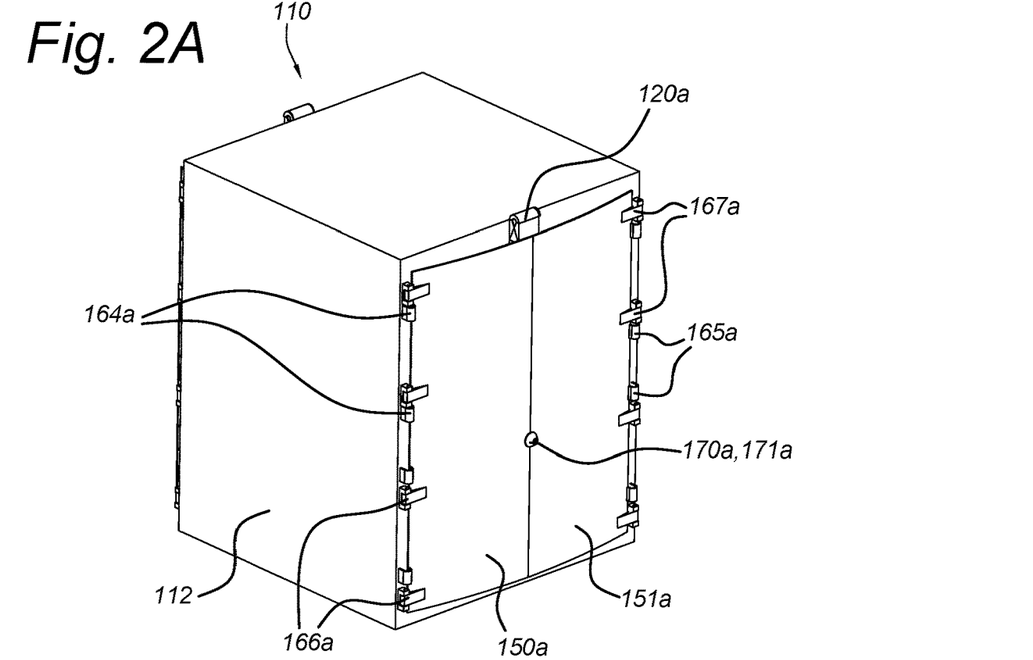
FIGS. 2a-2d show perspective views of an embodiment of a solar array and radiator substrate arrangement.
Figure 2B:
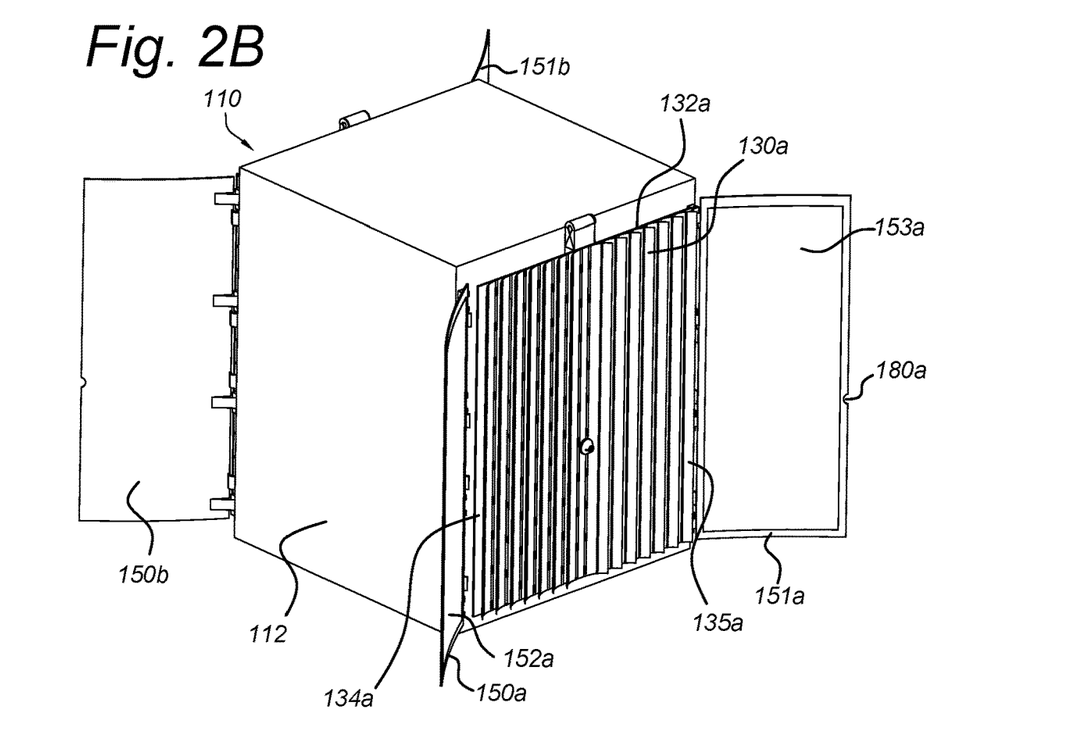
Figure 2C:
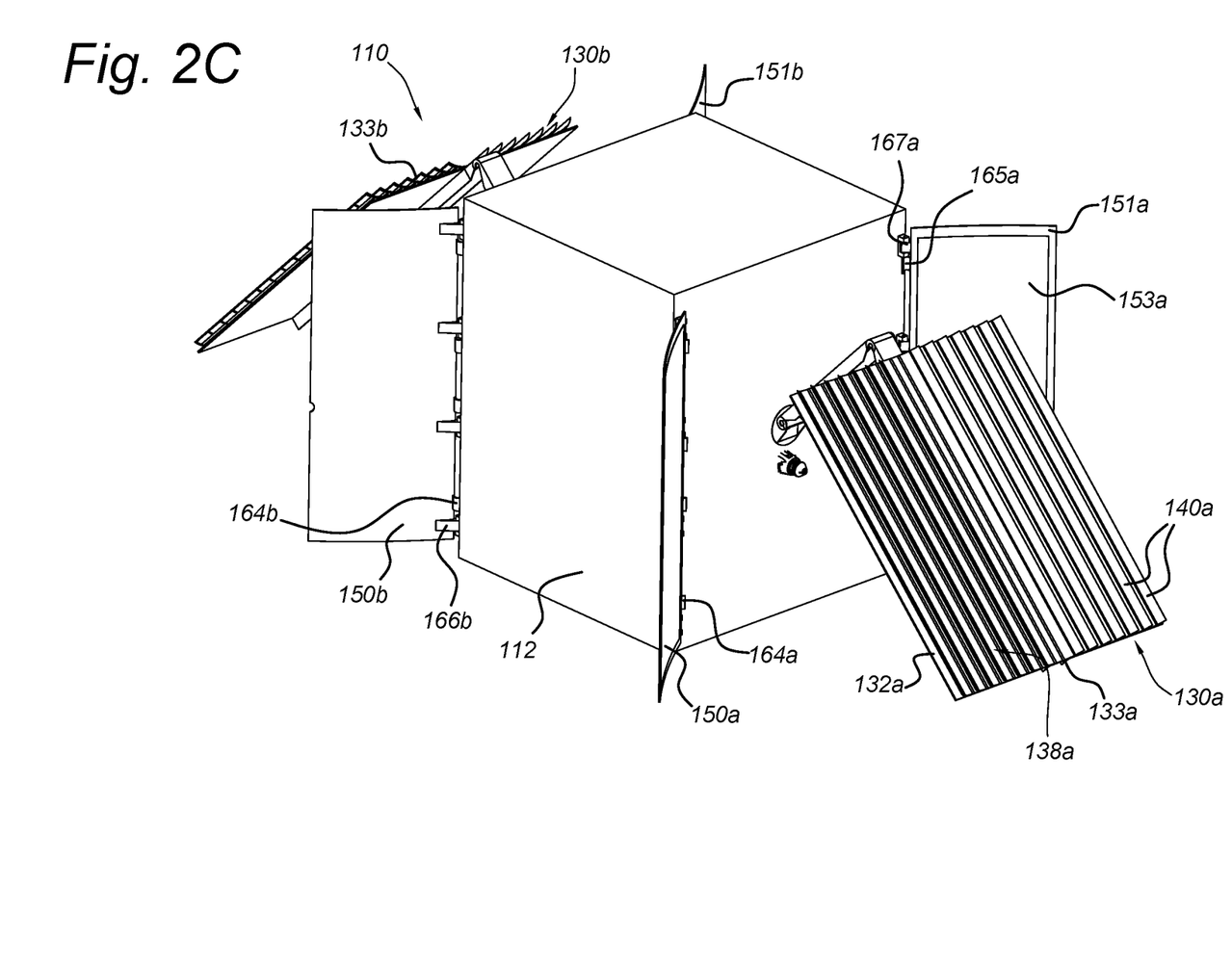
Figure 2D:
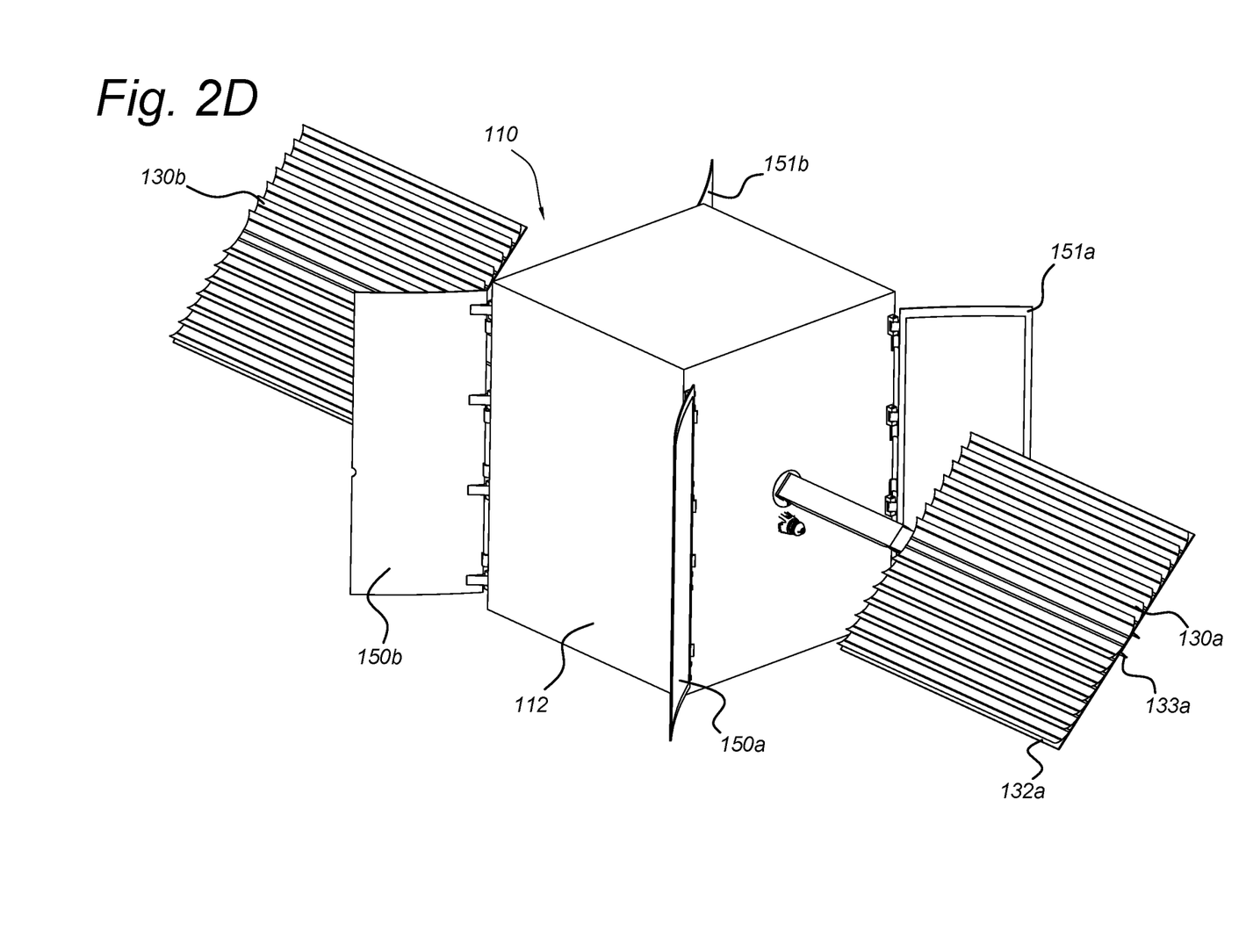

FIGS. 2a-2b illustrate a transition for the spacecraft 110 from its stowed state (FIG. 2a) into its deployed state (FIG. 2d). It should be understood that the stowed state generally precedes the deployed state. A spacecraft 110 is not likely to transition from the deployed state back into the stowed state while traversing space (e.g. in planetary orbit), unless recovery or retrieval of the spacecraft 110 is required.

FIG. 2a presents a perspective view of the spacecraft 110 in the stowed state. In this exemplary embodiment, the support panels 132 of the solar arrays 130 are sufficiently flexible to allow them to be retained in the stowed state, thus allowing the solar arrays 130 to be kept restrained against the corresponding lateral walls 114 of the satellite body 112. In this stowed state, the support panels 132 are held in a curved shape. In their retracted state, the concentrator reflector members 140 may also be retained in this curved manner. The thermal radiators 150, 151 are sufficiently flexible to follow the curvatures of the bent support panels 132, which allows the solar arrays 130 and the radiator substrates 152, 153 to be kept in abutting arrangements in the stowed state. By such initial bending of the solar panel and thermal radiator arrangements, the resonance characteristics of the arrangements may be shifted away from the mechanical vibration behavior of the launch vehicle during the launching phase, thus reducing the probability of inducing unwanted mechanical resonances.

In this exemplary embodiment, the solar arrays 130 are kept in their stowed state by means of the thermal radiators 150, 151. In particular, the thermal radiators 150, 151 help in keeping the concentrator reflector members 140 restrained in their retracted state onto the upper surface 138 of the support panel 132.

The hold-down mechanisms 170 provided on the lateral surfaces 114 of the satellite body 112 each comprise an actuator unit 171 for affixing the corresponding solar array panel 130 and overlapping thermal radiators 150, 151 to the satellite body 112. Once the hold-down mechanism 170 is released, the thermal radiators 150, 151 are released as well.

FIGS. 3a-3d depict another embodiment of a spacecraft 210. Features in the spacecraft 210 that have already been described above with reference to the first spacecraft embodiment (and in particular FIG. 1) may also be present in the spacecraft 210 shown in FIGS. 3a-3d, and will not all be discussed here again. For the discussion with reference to FIGS. 3a-3d, like features are designated with similar reference numerals preceded by 200, to distinguish the embodiments.

Figure 3A:
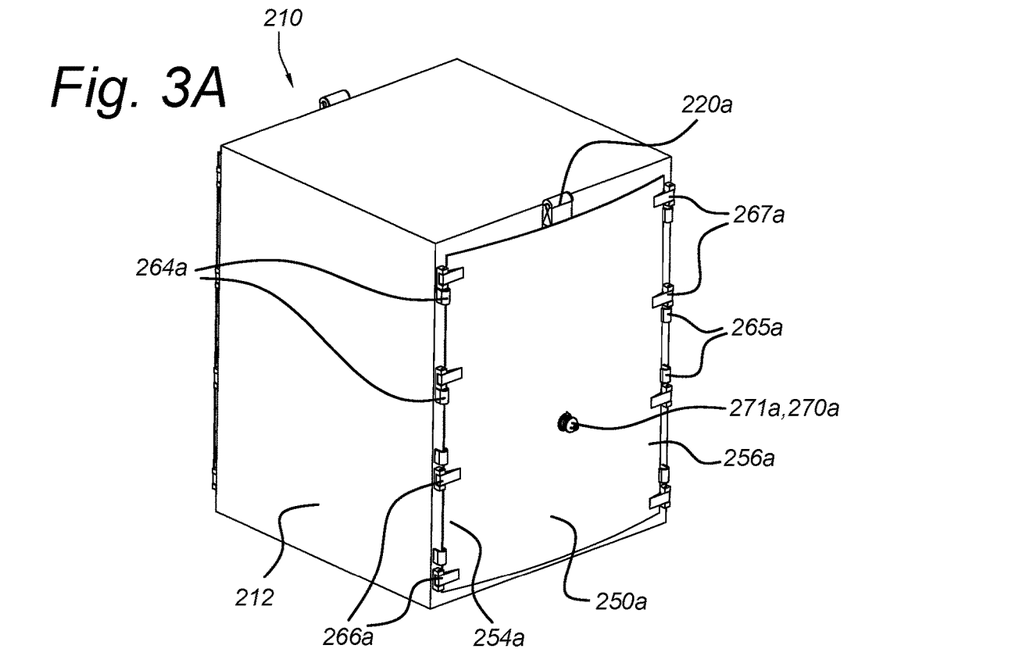
FIGS. 3a-3d show perspective views of another embodiment of a solar array and radiator substrate arrangement.
Figure 3B:
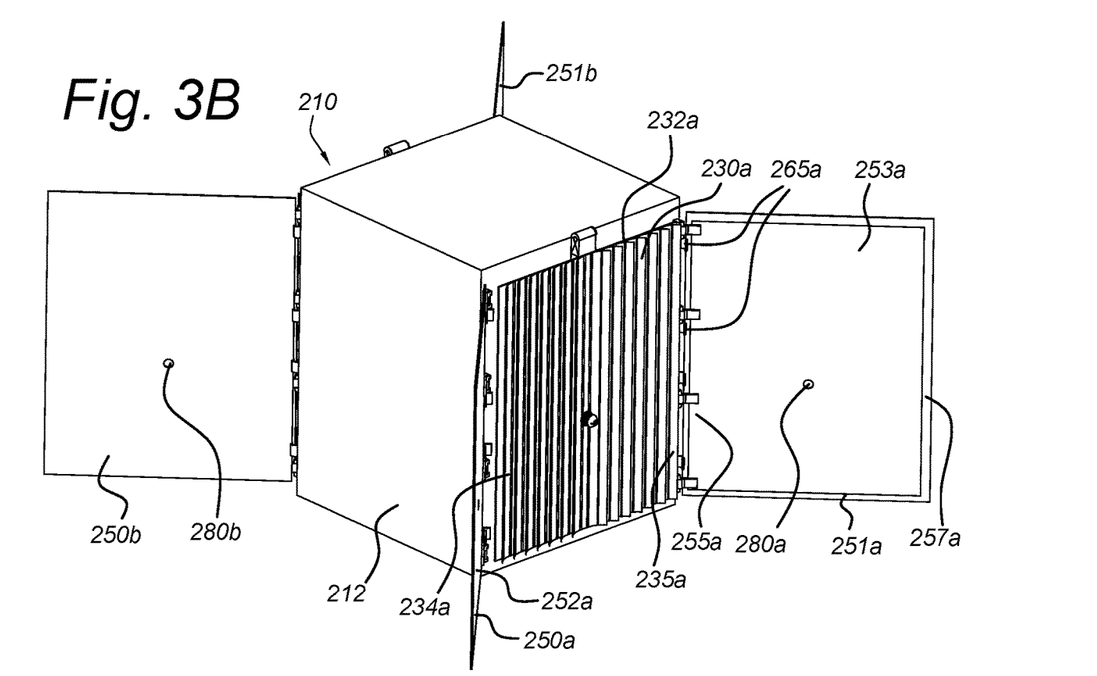
Figure 3C:
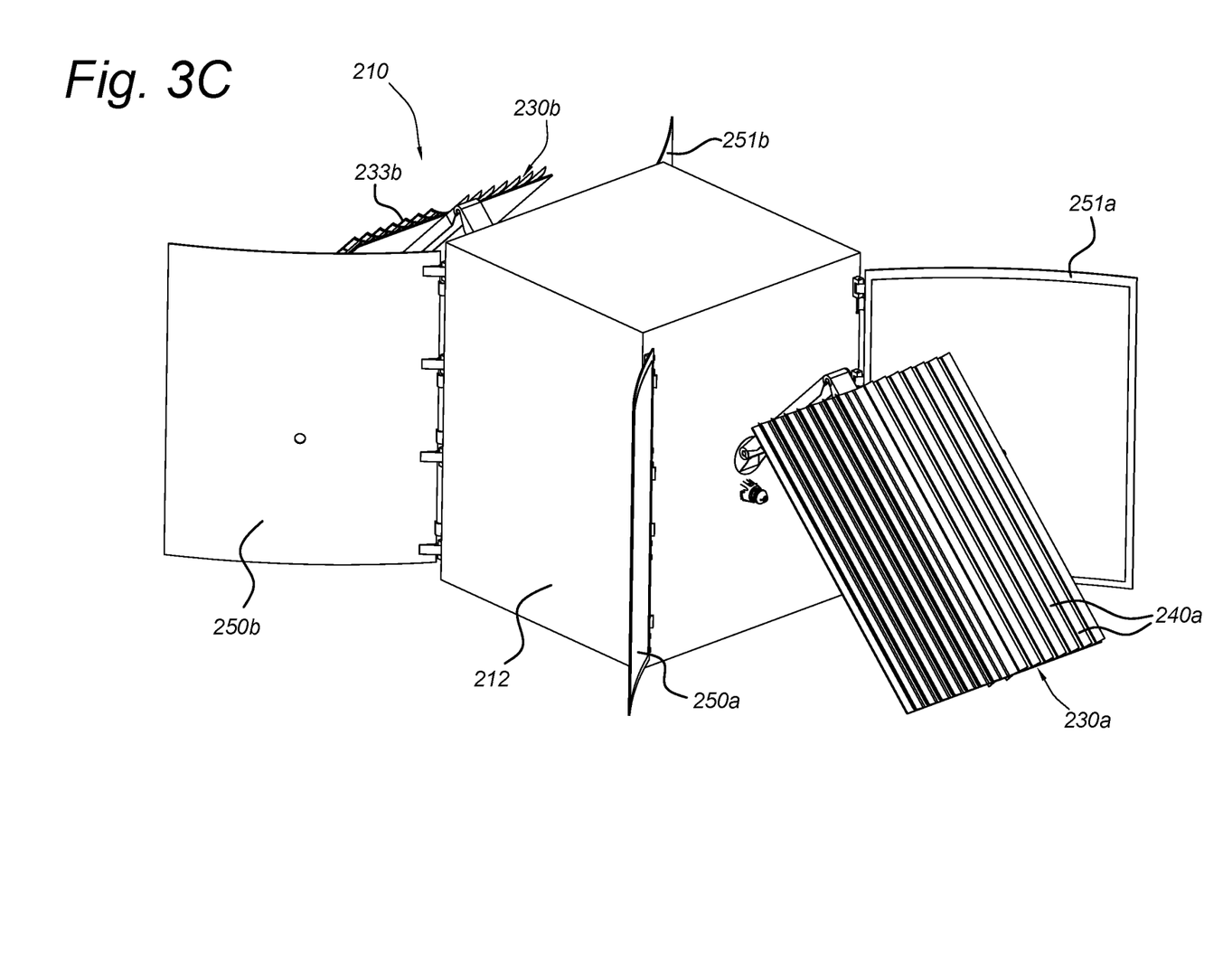
Figure 3D:
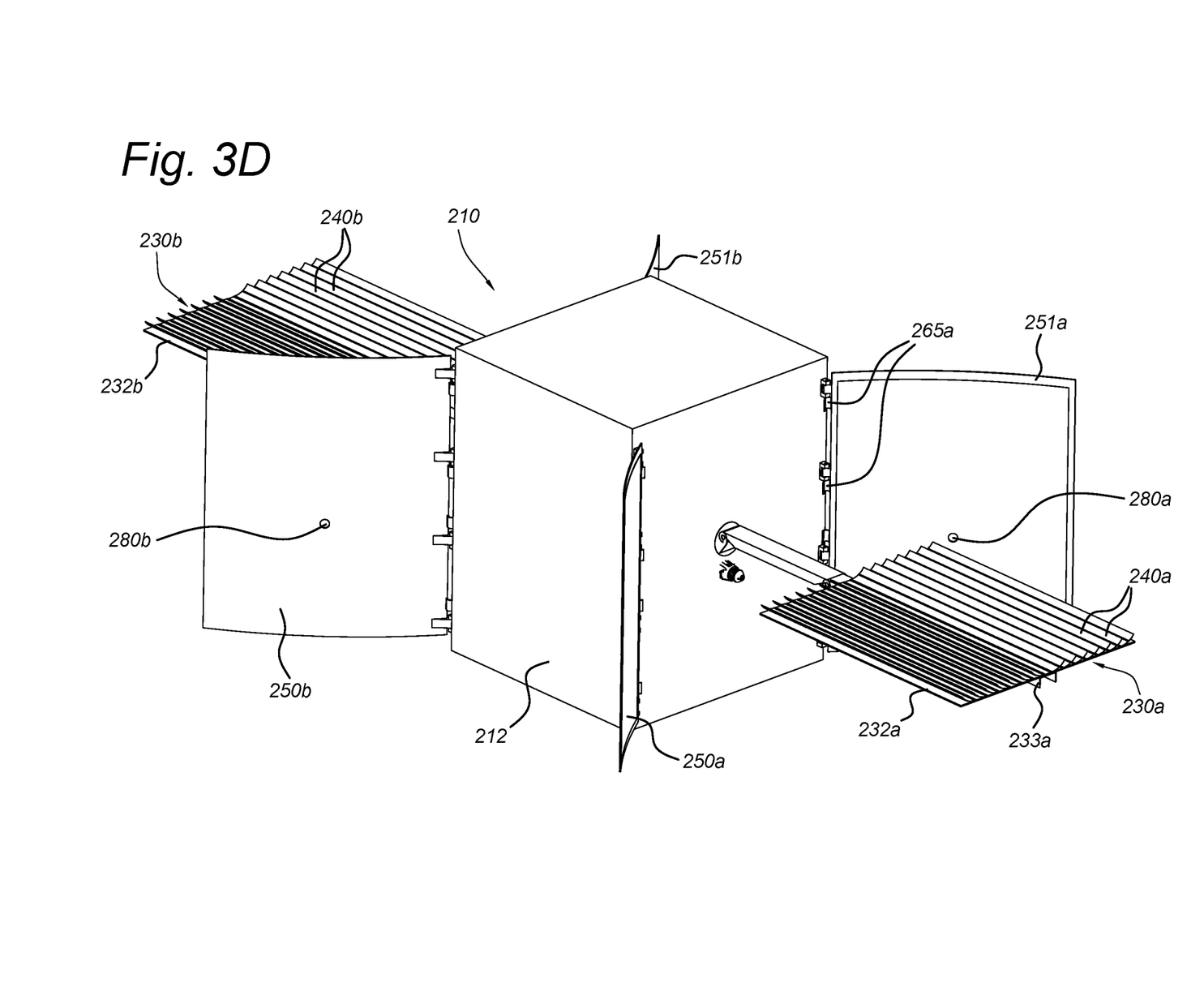

FIG. 3a presents a perspective view of the spacecraft 210 in the stowed state. Also in this embodiment, the solar array panel 230 is sufficiently flexible to allow it to be retained in a curved shape when the solar array 230 or spacecraft 210 is in the stowed state. Also in this example, the hold-down mechanism 270 on a lateral surface of the satellite body 212 comprises an actuator unit 271 for releasably fixing the corresponding solar array panel 230 and overlapping thermal radiators 250, 251 to the satellite body 212. The thermal radiators 250, 251 (as well as the solar panels) may be provided with hold-down apertures 280 that allow a releasable portion of the actuator unit 271 to extend through and restrain the respective thermal radiators 250, 251 (and solar panel 230) in the stowed state.

In this embodiment, the thermal radiator 250 and the further thermal radiator 251 each have an in-plane length that is similar to the transverse dimension of the associated solar array 230. In the stowed state, the thermal radiator 250 and the further thermal radiator 251 may be folded together into stowed positions, so as to mutually overlap and jointly cover the solar array 230, thereby retaining the support panel between the body 212 and the radiator substrates 252, 253 (see FIG. 3a). When in the stowed state, the thermal radiator 250 and the further thermal radiator 251 may thus function as edge retaining members for fixing the associated solar array 230 with respect to the body 212. Each of the thermal radiators 250, 251 may thereby press down with a coupled edge 254, 255 and a free edge 256, 257 a respective one of opposite lateral edges 234, 235 of the support panel 232 towards the satellite body 212, to keep the solar panels 230 in their curved pre-stressed shape.

FIGS. 4a-4d illustrate an alternative embodiment of a spacecraft 310. Features in the spacecraft 310 that have already been described above with reference to the first spacecraft 10 (and in particular FIG. 1) may also be present in the spacecraft 310 shown in FIGS. 4a-4d, and will not all be discussed here again. For the discussion with reference to FIGS. 4a-4d, like features are designated with similar reference numerals preceded by 300, to distinguish the embodiments.

Figure 4A:
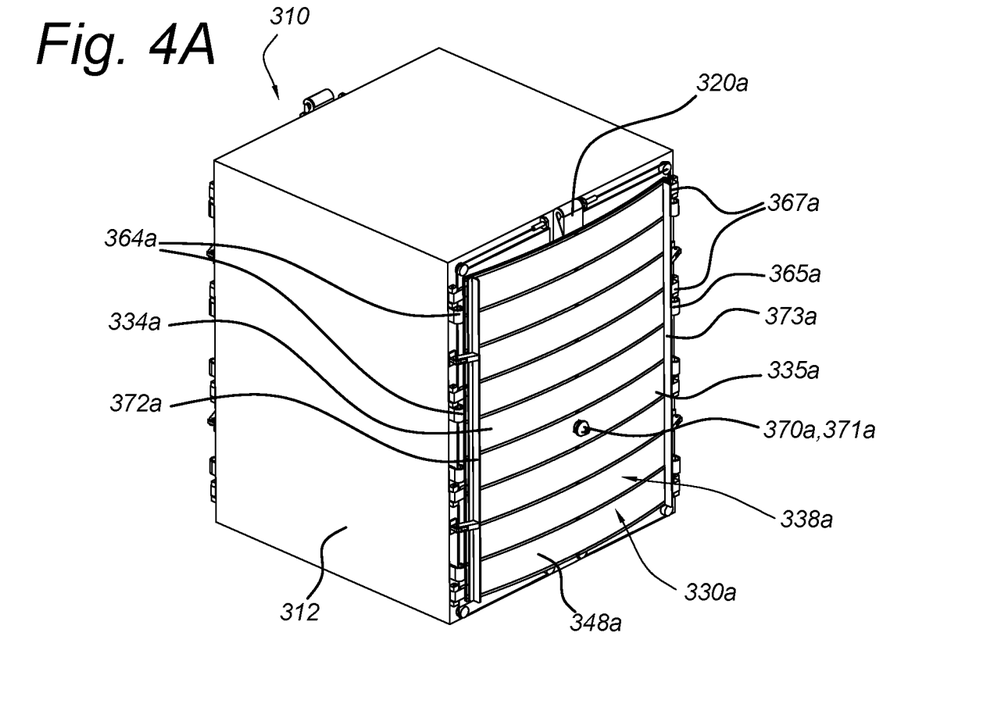
FIGS. 4a-4d show perspective views of yet another embodiment of a solar array and radiator substrate arrangement.

In this embodiment, the radiator substrates 350, 351 are located underneath a rear side 339 of the associated solar array 330 when the spacecraft 310 is in the stowed state. Here, the solar array 330 further comprises a cover foil 348, which is arranged on a front surface 338 of the support panel 332, where the concentrator reflector members 340 also reside. The cover foil 348 is arranged directly on top of the concentrator reflector members 340, to cover and protect the concentrator reflector members 340 in their retracted state, and to prevent them from prematurely transitioning into the extended state. The cover foil 348 may for example comprise a lightweight polyimide film.

This embodiment allows the use of a hold-down mechanism 370 with only one central actuator unit 371. This central actuator unit 371 can be activated to allow release of both the solar array panel 330 and the radiator substrates 352, 353. The hold-down mechanism 370 comprises edge retaining members 372, 373, which are configured for fixing the solar array 330 with respect to the satellite body 312 when the solar array 330 is in the stowed state.

The hold-down mechanism 370 may further comprise release cables 376, which extend between the central actuator unit 371 and the edge retaining members 372, 373 along outer edges of the solar panel 330.

FIG. 4a depicts the solar array 330 with concentrator reflector members 340 in a retracted state. The cover foil 348 is arranged directly on top of the concentrator reflector member 340, to cover the concentrator reflector members 340 in the retracted state, and to prevent the concentrator reflector members 340 from repositioning into the extended state. The cover foil 348 may serve as a shielding layer for the concentrator reflector members 340 as long as the solar panels 330 remain in the stowed state (e.g. during launch of the spacecraft 310). FIG. 4a also depicts the retaining members 372, 373 in a clamped down state. The retaining members 372, 373 have engagement ledges that are canted to press down opposite lateral edges 334, 335 of the solar panels 330 towards the satellite body 312, when the solar array 330 is in the stowed state. In this clamped state, the ledges keep the support panel 332 in the curved pre-stressed shape. The ledges of the retaining members 372, 373 also press the pre-tensioned cover foil 348 down onto the front panel surface 338, and prevent it from rolling up. In addition, the support panel 332 of each solar array 330 presses down with its rear side 339 on the coupled edges 354, 355 of the associated thermal radiators 350, 351. This helps to keep the radiator substrates 352, 353 fixed against the satellite body 312 in the stowed state.

Figure 4B:
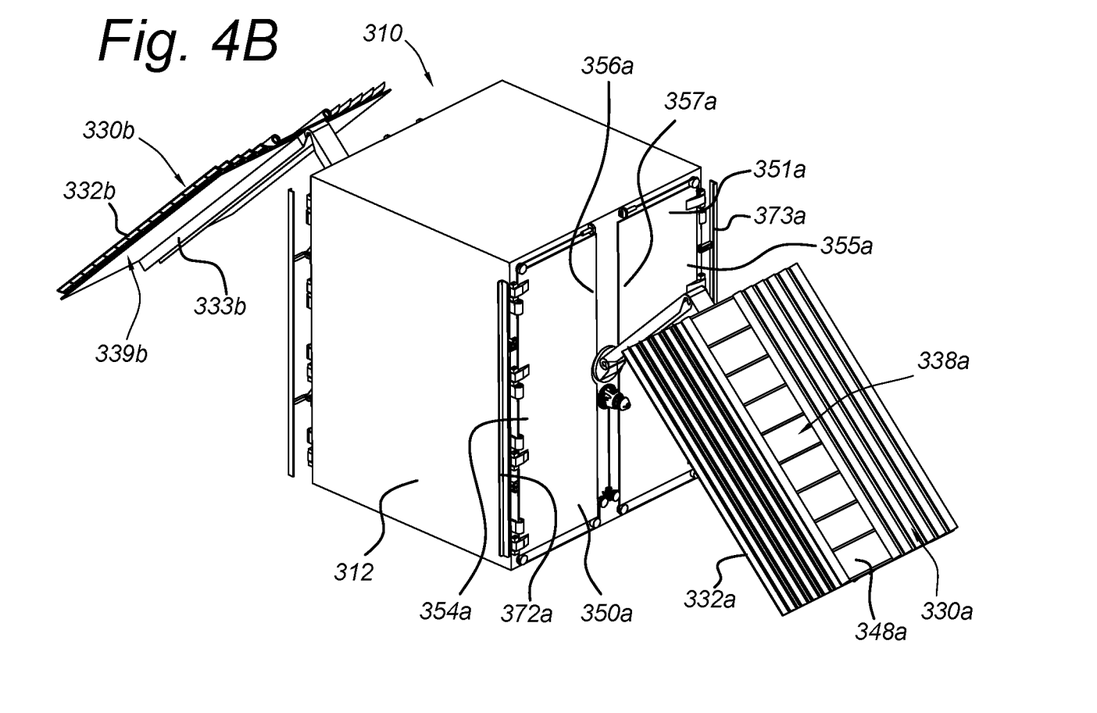

FIG. 4b depicts an intermediate stage of deployment of the solar arrays 330. The cover foil 348 is pre-tensioned in such a manner that release of the cover foil 348 would cause it to roll up about an axis towards a centerline of the support panel 332.

In FIG. 4b, the retaining members 372, 373 have been released from the panel edges 334, 335. This release allows the pre-tensioned support panel 332 to curve back to its equilibrium state, which is flat in this embodiment. The removal of the retaining members 372, 373 also releases the cover foil 348, so that the pre-tensioning of the cover foil 348 causes it to roll up. This rolling up exposes a portion of the concentrator reflector members 340 and allows them to transition into their extended state.

Release of the retaining members 372, 373 also allows the arm mechanism 316-320 (see FIG. 4d) to unfold and the solar panel 330 to deploy. As a result of the panel deployment, the thermal radiators 350, 351 are uncovered.

Figure 4C:
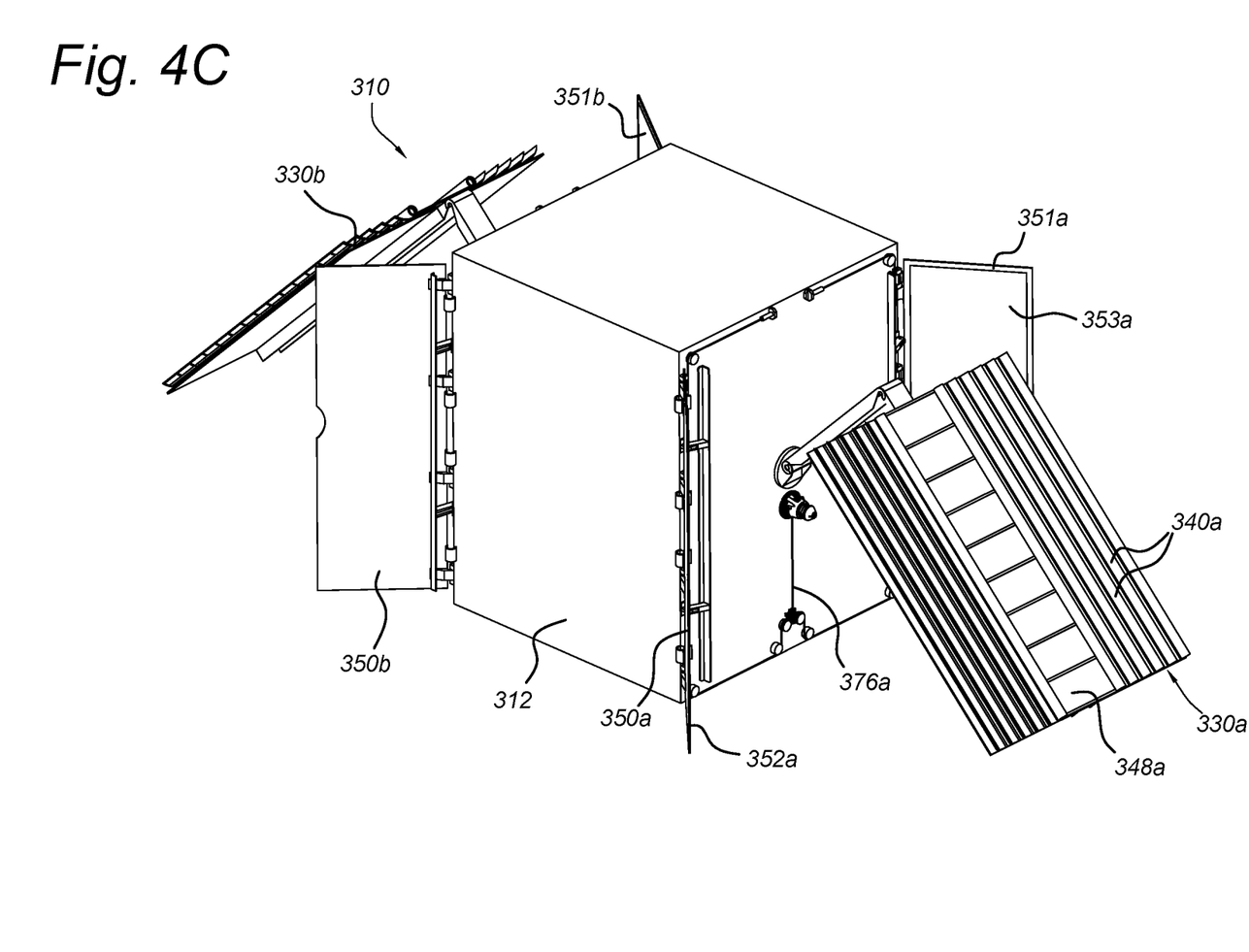

FIG. 4c illustrates that the thermal radiators 350, 351 are now also allowed to unfold to their respective extended positions.

Figure 4D:
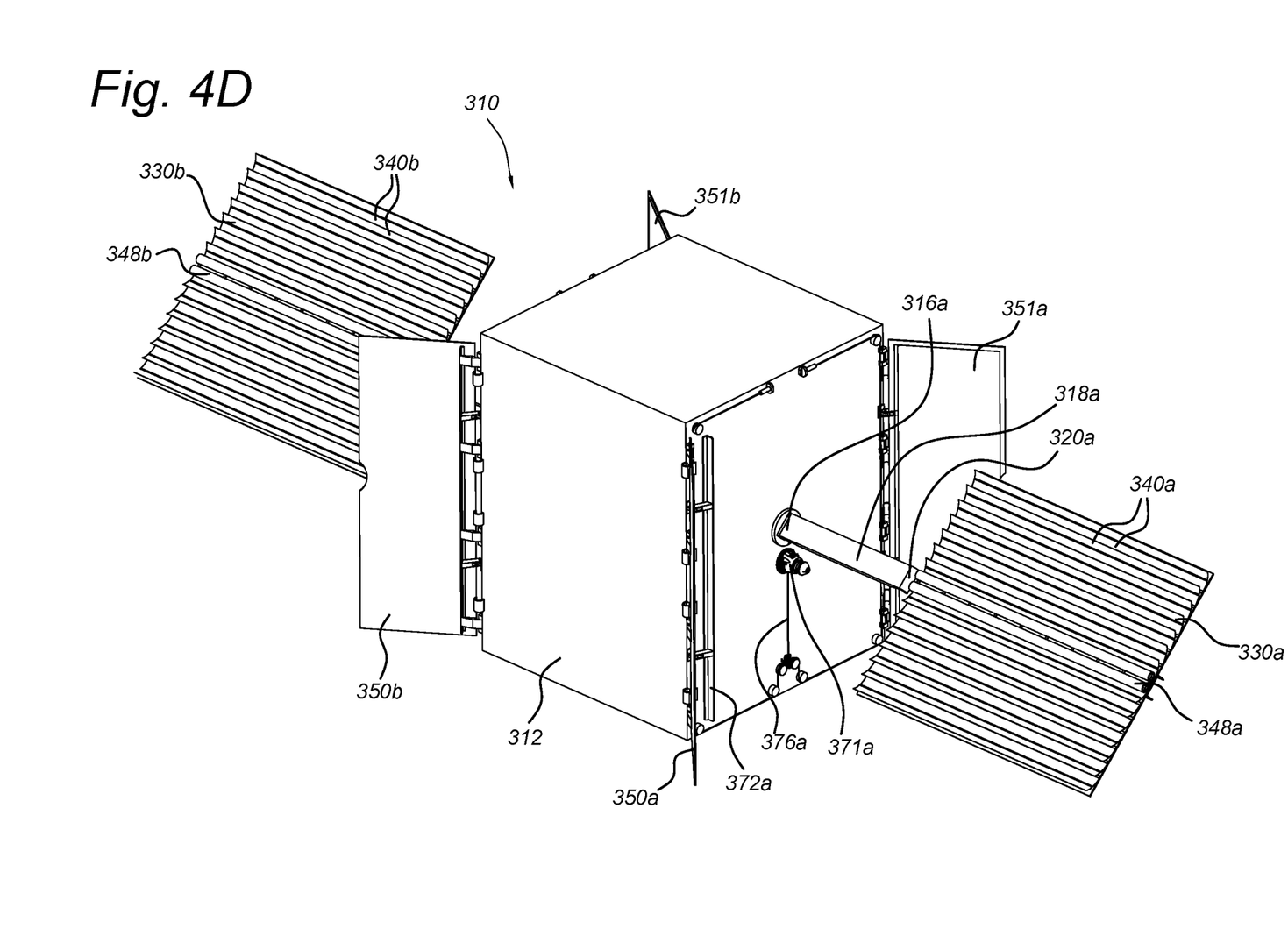

FIG. 4d shows the solar panels 330 extended into their fully deployed state.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. It will be apparent to the person skilled in the art that alternative and equivalent embodiments of the invention can be conceived and reduced to practice. All changes which come within the meaning and range of equivalency of the claims are to be embraced within their scope.

In the above examples, the spacecraft was formed as a satellite unit with a satellite body has been schematically depicted as a box with multiple faces. In other embodiments, however, the spacecraft may comprise a body having a different shape.

The spacecraft may include a single solar array or multiple solar arrays. The number of solar arrays carried by the spacecraft will depend on the power required by the spacecraft, and each solar array may have any number of solar panels. The (at least one) solar array may comprise a plurality of solar array panels, which may for example be hingedly coupled to each other to allow folding up into a stack of solar panels in a stowed state prior to launch, and to allow unfolding into an co-planar sequence of panels in a deployed state after the launched spacecraft has assumed its intended trajectory in space (e.g. a planetary orbit). Embodiments are conceivable with multi-panel arrangements that for example are deployable into a linear arrangement or a cross-shaped arrangement.

Alternatively or in addition, the arm or primary deployment boom that connects the solar panel to the spacecraft body may be segmented and articulated to allow a larger extent of the arm in the deployed state.

In the examples discussed above with reference to FIGS. 2a-4d, the solar panel and thermal radiator were retained in a simple convex shape, when in the stowed state. In alternative embodiments, the support panel of the solar array and the abutting radiator substrate in the stowed state may involve more complex curved shapes.

Moreover, those skilled in the art and informed by the teachings herein will realize that the abutting arrangement of solar array and radiator substrate according to the first aspect of the invention is not limited to satellites, but may be beneficially employed in any spacecraft that includes at least one solar array and thermal radiator substrate. The proposed solar array and radiator substrate could also be included in or on landing rovers on deep space missions.

Note that for reasons of conciseness, the reference numbers corresponding to similar elements in the various embodiments (e.g. elements 110, 210, 310 being similar to element 10) have been collectively indicated in the claims by their base numbers only i.e. without the multiples of hundreds. However, this does not suggest that the claim elements should be construed as referring only to features corresponding to base numbers. Although the similar reference numbers have been omitted in the claims, their applicability will be apparent from a comparison with the figures.

LIST OF REFERENCE SYMBOLS

Similar reference numbers that have been used in the description to indicate similar elements have been omitted from the list below, but should be considered implicitly included.
10 spacecraft (e.g. satellite unit)
12 spacecraft body (e.g. satellite body)
14 lateral body surface
16 joint
18 arm (boom)
20 further joint
30 solar array
32 support member (e.g. support panel)
33 reinforcement member (e.g. beam)
38 first panel surface (e.g. front surface)
39 second panel surface (e.g. rear surface)
40 concentrator reflector member (e.g. flexible strip)
48 cover foil
50 thermal radiator
51 further thermal radiator
52 radiator substrate
53 further radiator substrate
54 coupled radiator edge
55 further coupled radiator edge
56 free radiator edge
57 further free radiator edge
58 radiator frame (e.g. batten frame)
59 further radiator frame (e.g. further batten frame)
64 heat link
65 further heat link
66 hinge connection
67 further hinge connection
70 locking mechanism (e.g. thermal knife unit or pyro-unit)
71 actuator mechanism
76 tensioning cable
80 hold-down aperture
134 first longitudinal panel edge
135 second longitudinal panel edge
372 retaining member
373 further retaining member

What is claimed is:

1. A spacecraft, comprising:
a body;
a solar array, including a support panel which is articulately connected to the body;
a thermal radiator, which is articulately connected to the body, and which includes a radiator substrate that is thermally coupled to the body via at least one heat link;
the solar array comprising a plurality of concentrator reflector members, each concentrator reflector member including a photovoltaic cell and a reflective area and being mechanically coupled to the support panel along one edge and suspended freely and bendable away from the support panel along an opposite edge;
the support panel and the thermal radiator being elastically deformable to allow the solar array and the thermal radiator to be temporarily bent from a mechanical equilibrium shape into a similarly curved and mutually overlapping arrangement;
wherein the solar array and thermal radiator are configured to be transitioned from;
a stowed state wherein the support panel and the radiator substrate are held fixed in an curved and mutually overlapping arrangement along and near the body, with the support panel situated between the body and the radiator substrate, and with the radiator substrate functioning as a protective cover that temporarily abuts and retains the concentrator reflector members flattened against the support panel, to a deployed state wherein the solar array is formed back to its equilibrium shape and is unfolded with the support panel positioned at a distance from the body and the radiator substrate is folded away from the body and the solar array, thereby allowing the concentrator reflector members to raise and reposition into an extended state and allow the reflective areas to reflect solar radiation towards the exposed photovoltaic cells.

2. The spacecraft according to claim 1, wherein the support panel is elastically deformable to allow the solar array to be temporarily bent from a flat equilibrium shape into a curved panel shape near the body to provide geometrical stiffness in the stowed state, and wherein the thermal radiator is elastically deformable to allow the thermal radiator to be temporarily bent into a form that follows a curvature of the temporarily curved panel shape, to keep the solar array and the radiator substrate in a similarly curved and overlapping arrangement having an increased mechanical resonance frequency in the stowed state compared to the deployed state.

3. The spacecraft according to claim 1, wherein the flexible radiator substrate is configured to be temporarily pre-tensioned, to retain the solar array in the curved shape and increase the geometrical stiffness in the stowed state of the spacecraft.

4. The spacecraft according to claim 1, wherein the photovoltaic cell and the reflective area are provided on opposite sides of each respective concentrator reflector member.

5. The spacecraft according to claim 1, wherein the thermal radiator is hingeably coupled along a radiator edge to the body, and wherein the spacecraft comprises a further thermal radiator with a further radiator substrate, which is hingeably coupled along a corresponding radiator edge to the body on an opposite side of the solar array.

6. The spacecraft according to claim 5, wherein at least one of the thermal radiator and the further thermal radiator are adapted to fix the solar array along at least one edge of the support panel with respect to the body when in the stowed state.

7. The spacecraft according to claim 6, wherein in the stowed state, the thermal radiator and the further thermal radiator mutually overlap, and jointly cover the support panel of the solar array, thereby retaining the support panel between the body and the radiator substrates.

8. The spacecraft according to claim 7, wherein the photovoltaic cell and the reflective area are provided on opposite sides of each respective concentrator reflector member.

9. The spacecraft according to claim 1, comprising a hold-down mechanism for simultaneously fixing the solar array and the thermal radiator to the satellite body in the stowed state, wherein the support panel is at least partially flexible to allow the solar array to be temporarily retained in a bent panel shape near the body to provide geometrical stiffness in the stowed state.

10. The spacecraft according to claim 9, wherein the support panel is elastically deformable to allow the solar array to be temporarily retained in a curved shape to provide the geometrical stiffness in the stowed state of the spacecraft.

11. The spacecraft according to claim 9, wherein the hold-down mechanism comprises retaining members, which are configured to press down lateral edges of the support panel towards the spacecraft body and to temporarily retain the support panel in the bent panel shape, when the spacecraft is in the stowed state.

12. The spacecraft according to claim 1, wherein the thermal radiator includes a radiator frame formed by a lattice arrangement of flexible battens or girders, wherein the radiator frame supports and spans the radiator substrate.

* * * * *